(12) United States Patent
Shiga (10) Patent No.: US 8,310,255 B2
(45) Date of Patent: Nov. 13, 2012

(54) SENSING PROBE FOR MEASURING DEVICE PERFORMANCE

(75) Inventor: Ikuma Shiga, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 287 days.

(21) Appl. No.: 12/841,580

(22) Filed: Jul. 22, 2010

(65) Prior Publication Data
US 2011/0018567 A1  Jan. 27, 2011

(30) Foreign Application Priority Data
Jul. 24, 2009 (JP) ................................ 2009-173574

(51) Int. Cl.
*G01R 31/20* (2006.01)
*G01R 1/067* (2006.01)

(52) U.S. Cl. .............................. 324/754.01; 324/755.01

(58) Field of Classification Search .. 324/755.01–755.1, 324/762.01–762.1, 754.01–754.3; 439/291, 439/729, 482; 257/48; 438/14–18
See application file for complete search history.

(56) References Cited

U.S. PATENT DOCUMENTS
5,003,255 A * 3/1991 Kazama ................... 324/754.03
7,102,369 B2 * 9/2006 Jung ........................ 324/754.14

FOREIGN PATENT DOCUMENTS
JP 2002-202323 A 7/2002
JP 2004-069508 A 3/2004
JP 2006-090941 A 4/2006

* cited by examiner

*Primary Examiner* — Tung X Nguyen
(74) *Attorney, Agent, or Firm* — Venable LLP; Michael A. Sartori (57) ABSTRACT

A sensing probe for measuring device performance electrically at a delivery inspection is disclosed. The probe comprises a plunger, a barrel and a coil spring. The plunger provides a groove in an outer surface thereof, while, the inner surface of the barrel provides a projection. The groove comprises a plurality of unit patterns including a front groove and a rear groove. The projection slides in the front groove as the plunger is pulled into the barrel, while, it slides in the rear groove as the plunger is pushed out from the barrel. Moreover, the plunger rotates in the barrel as the projection slides in the front and rear grooves, which makes an area of the plunger coming in contact with the barrel always fresh and lowers the contact resistance between them.

9 Claims, 6 Drawing Sheets

SENSING PROBE FOR MEASURING DEVICE PERFORMANCE

BACKGROUND OF THE INVENTION

1. Field of the Invention

The present invention relates to a contact probe able to reduce contact resistance between the plunger and the barrel and to enhance durableness.

2. Related Prior Art

Electrical inspection of discrete semiconductor device such as laser diode and wafer forming a plurality of devices therein uses a contact probe. Specifically, for the inspection of a semiconductor device, a tip of the plunger elastically comes in contact on a pad of the device to measure the electrical performance and to supply the power to the device.

Typical contact probe provides a plunger, a barrel to receive the plunger and a spring to push the tip of the plunger out of the barrel. The plunger and the barrel may be made of electrically conductive material. The plunger may slide along the axis of the barrel and the electrical conductive path may be formed by making the plunger in contact to the inner surface of the barrel.

A Japanese patent application published as JP 2002-202323A has disclosed a contact probe that provides a mechanism to convert rectilinear motion of a pin into rotational motion around an axis. Another Japanese patent application published as JP2006-090941A has disclosed a contact probe with a plunger, a bias pin and a spring, in which the plunger has a sloped surface in a side facing the spring, while, the bias pin has a tapered surface in a side facing the plunger, and the bias pin is arranged between the plunger and the spring. A Japanese patent Application published as JP2004-069508A has disclosed another contact probe with a plunger whose tip has a crown shape.

A conventional contact probe has a plunger with a limited area coming in contact with the barrel. The plunger, by sliding along the axis of the barrel, a limited surface of the plunger always comes in contact with the barrel. Accordingly, an iterating use of the probe causes abrasion the area, which makes the contact resistance therebetween instable and the durability the durability worse. The crowned shape of the tip of the plunger disclosed in the Japanese patent mentioned above may rotate itself and vary the area to come in contact with the conductive tube by butting against the solder ball. However, the rotation of the plunger strongly depends on a condition of the crowned tip of the plunger and the area coming in contact with this tip. Accordingly, a flat area may not induce the rotation of the plunger and prevent the abrasion of the area securely.

SUMMARY OF THE INVENTION

A sensing probe of the invention, which is used to measure electrical performance of a semiconductor device in, for instance, a delivery inspection, has a feature that the plunger may rotate as the plunger is pushed out and pushed in the barrel, which makes an area of the plunger coming in contact with the barrel in fresh; accordingly, the contact resistance between the plunger and the barrel may be reliably secured in low resistance.

Specifically, the sensing probe comprises a barrel, an elastic member and a plunger. The barrel has a cylindrical shape to receive the plunger with a rod shape therein. The elastic member is set in a deep end of the plunger to push the plunger out from the barrel, while, the plunger is pushed in the barrel when the tip thereof comes in contact with an electrical pad of the semiconductor device. Thus, the plunger is movable within the barrel along an axis of the barrel.

The barrel provides a projection in an inner surface thereof, while, the plunger provides in a groove area thereof a groove is continuous in a circumference of the plunger by iterating a unit pattern including a front groove and a rear groove. The plunger of the present invention may rotate when the projection of the barrel slides within the front groove as the plunger is pushed into the barrel by the plunger coming in contact with the electrical pad of the semiconductor device. The plunger may also rotate when the projection slides within the rear groove in the next unit pattern as the plunger is pushed out from the barrel by a force of the elastic member. That is, the projection of the barrel changes the grooves one after another as the reciprocal motion of the plunger, and change of the groove may cause the rotation of the plunger, which may rub the surface of the plunger and the barrel coming in contact thereto and make the surfaces in fresh. Thus, the contact resistance between the barrel and the plunger may be securely stable in low resistance.

Moreover, the rotation of the plunger may strip an oxide layer inherently formed in a top of the electrical pad of the semiconductor device. Accordingly, the rotative plunger of the invention may also securely stabilize the contact resistance between the plunger and the device.

BRIEF DESCRIPTION OF DRAWINGS

The foregoing and other purposes, aspects and advantages will be better understood from the following detailed description of a preferred embodiment of the invention with reference to the drawings, in which.

DETAILED DESCRIPTION OF PREFERRED EMBODIMENTS

Preferred arrangements of the sensing probe according to the present embodiment of the invention will be described as referring to accompanying drawings. In the description of the drawings, the same elements will be referred by the same symbols or numerals without overlapping explanations.

Figure 1A:
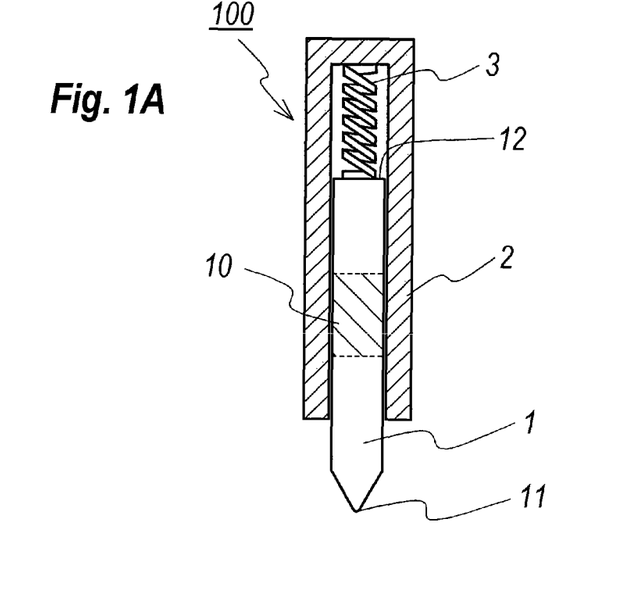
FIG. 1A schematically illustrates a cross section of a sensing probe according to an embodiment of the present invention, and FIG. 1B magnifies a head portion of a plunger where a groove in the plunger and a projection in the barrel are formed.
Figure 1B:
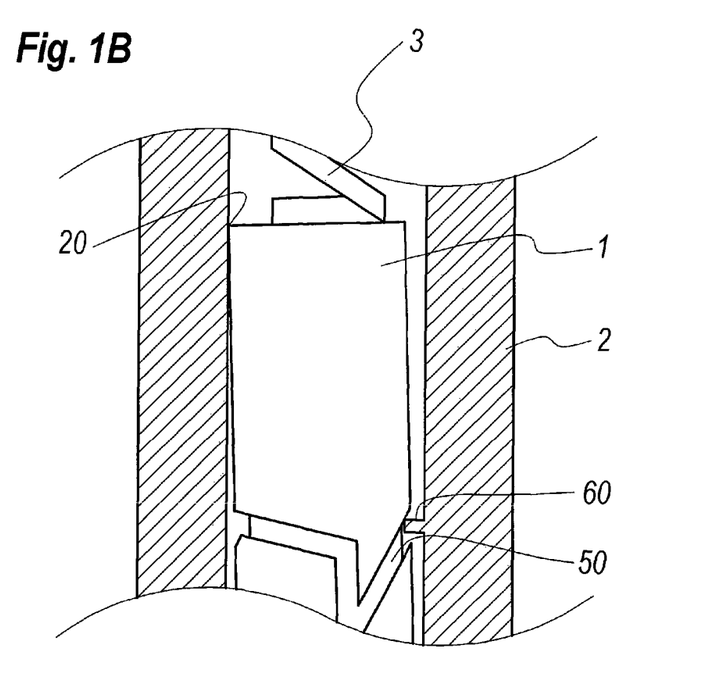

FIG. 1A shows the first embodiment of the sensing probe 100 that includes a plunger 1, a barrel 2 and an elastic member. The plunger 1, which has a shape of a bar made of electrically conductive material, is set within a bore of the barrel 2 so as to expose a tip 11 thereof from the end of the barrel 2. The barrel 2, which is also made of electrically conductive material, has a tubular shape with a closed end opposite to that from which the plunger 1 exposes. Between the plunger 1 and the bore of the barrel 2 is formed with a clearance such that the plunger 1 may slide in the bore of the barrel along the axis thereof and rotate around the axis. The plunger 1, as shown in FIG. 1B, comes in contact with the inner surface of the barrel 2 to secure an electrically conductive path between the plunger 1 and the barrel 2.

The plunger 1 and the barrel 2, which may be made of beryllium copper or nickel copper, may have a coating with, for instance, rhodium or gold to reduce the contact resistance therebetween. The embodiment shown in FIGS. 1A and 1B has the plunger 1 made of beryllium copper with rhodium coating and the barrel 2 made of also beryllium copper coated with gold in the inner surface thereof.

The elastic member 3, which is set in the deep end of the barrel 2, abut against the rear surface 12 of the plunger 1 to cause a force thereto so as to expose the tip 11 thereof from the open end of the barrel 2, and is compressed as the plunger 1 is pushed into the barrel 2. Thus, when the tip 11 of the plunger 1 comes in contact with a device to be tested, the plunger 1 is pushed within the barrel 2 so as to compress the elastic member 12 and cause the force against the device. Moreover, the magnitude of the force against the device may be adjustable depending on the stroke of the plunger 1 pushed into the barrel 2. The elastic member 3 may be a spring coil and a rubber. The embodiment shown in FIG. 1A provides the spring coil as the elastic member 3.

The plunger 1 provides an area 10 in an outer surface thereof in which a groove 50 is formed, while, the inner surface of the barrel 2 provides a projection 60 fit in the groove 50.

The groove 50, which if continuously formed in the outer surface of the plunger 1, receives the projection 60. Moving forward and backward the plunger 1, the projection 60 slides within the groove 50 and rotates the plunger 1 to vary the area thereof to come in contact with the barrel 2. Next, preferred and exemplary embodiments of the groove 50 and the projection 60 will be described.

First Embodiment

Figure 2A:
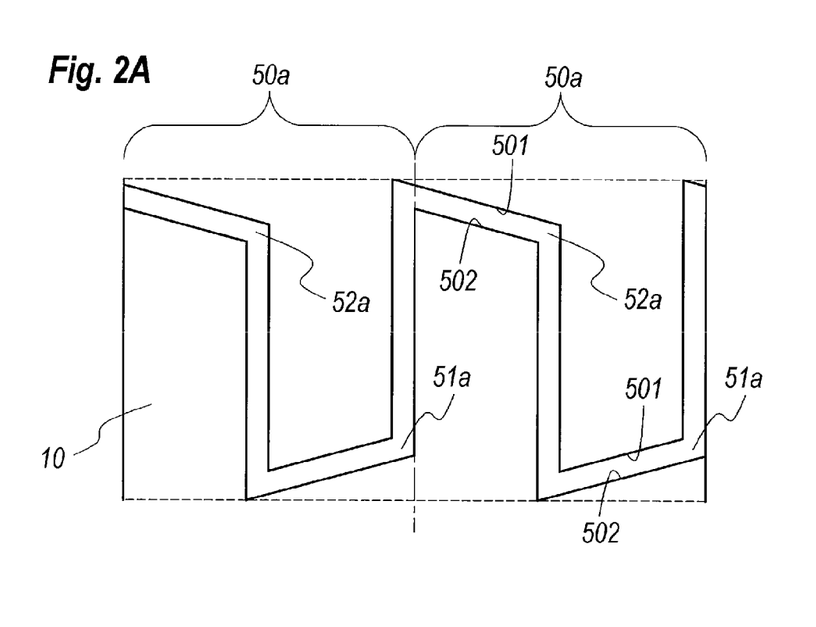
FIG. 2A is a developed view of the groove area according to the first embodiment of the invention, where the groove is formed in the plunger, and FIG. 2B explains the trace of the projection in the groove.
Figure 2B:
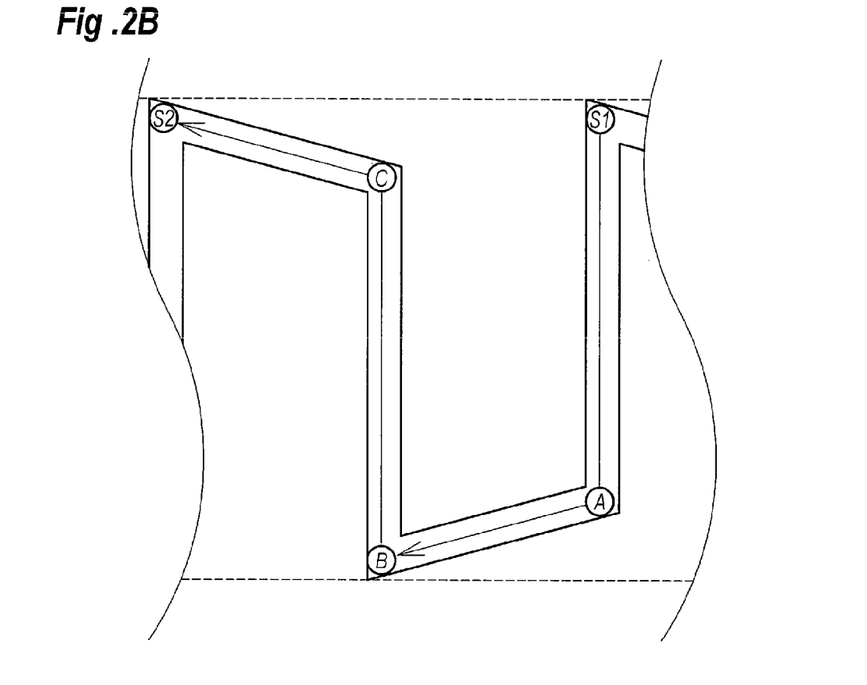

FIG. 2A is a developed view of the area 10 of the plunger 1 where the groove 50a is formed. The longitudinal direction of the page in FIGS. 2A and 2B is along the axis of the plunger 1, while, the downward corresponds to the tip of the plunger 1. Width of the area 10 coincides with the circumference of the plunger 1.

The groove iterates the same pattern 50a twice along the circumference, where the unit pattern 50a includes the front groove 51a advancing to the tip of the plunger and the rear groove 52a directing the rear end thereof. Two grooves, 51a and 52a, each including a straight groove extending in parallel with the axis of the plunger 1 and an inclined groove whose direction makes a substantial angle with the axis, continue to each other in the ends thereof, that is, the end of the straight groove continues the end of the inclined grove of the other unit, while, the other end of the inclined groove of the other unit continues to the other end of the straight groove. Thus, two unit patterns 50a are smoothly connected to the other.

FIG. 2B explains the trace of the projection in the groove as the plunger 1 iterates the forward and rearward motion. First, when the plunger 1 is free from the pad to be come in contact therewith, the plunger 1 is pushed out by the coil and the projection 60 is set at the point S1. When the plunger 1 in the tip thereof comes in contact with the pad and is pushed into the barrel 2, the projection 60 slides within the front groove 51a to a point B. Synchronous with the slide of the projection 60 from the point A to the point B, the plunger 1 may rotate in the barrel 2. When the plunger 1 is detached from the pad, the projection 60 slides in the rear groove 52a to the point S2, which is equivalent to the point S1 in the other unit pattern. As the projection 60 moves from the point C to the point S2 in the rear groove, the plunger 1 may further rotate in the same direction as that of the former rotation.

One cycle of the forward and rearward motion of the plunger 1 causes the rotational motion thereof by 180°, which changes the area of the plunger 1 to come in contact to the barrel 2 and makes the contact resistance therebetween stable.

Second Embodiment

Figure 3A:
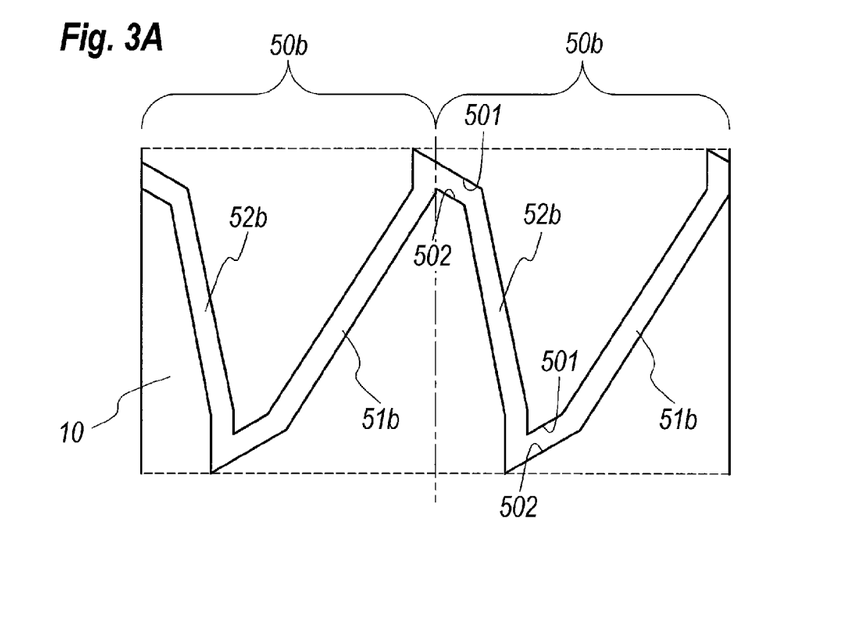
FIG. 3A is a developed view of the groove area according to the second embodiment of the invention, and FIG. 3B explains the trace of the projection in the groove.

FIG. 3A is a developed view of the area 10 according to the second embodiment of the invention. As shown in FIG. 3A, the front groove 51b has a feature, which is distinguishable from those in the former embodiment shown in FIGS. 2A and 2B, that there is almost no straight groove extending substantially in parallel with the axis of the plunger 1. Specifically, the area 10 provides two unit patterns 50b along the circumference of the plunger 1. The unit pattern 50b provides the front groove 51b and the rear groove 52b, where each rear groove 52b is smoothly connected with the front groove 51b in the other unit pattern 51b.

Figure 3B:
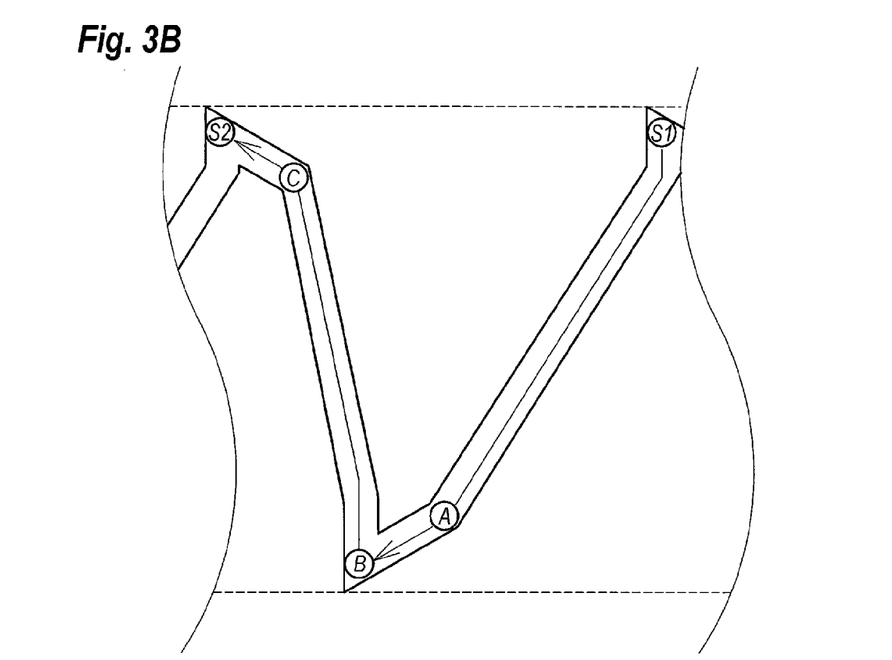

Before the tip of the plunger 1 is come in contact with the pad, similar to those of the first embodiment, the projection 60 is set at the point S1 in the end of the front groove 51b. Coming the tip of the plunger 1 in contact with the pad and pushing thereto, the projection 60 slides from the point S1 to the point B in the front groove 51b. Working together with the slide of the projection 60 from the point S1 to the point B through the point A, the plunger 1 may rotate. That is, the plunger 1 continuously rotates, not intermittent rotation, as the frontward motion thereof from the touch with the pad to the condition fully pushed in. Then, when the plunger 1 is detached from the pad, the projection 60 slides from the point B to the point S2 in the rear groove 52b. Working together the slide of the projection 60, the plunger 1 may rotate in the same direction with that where the projection 60 slides in the front groove 51b.

Moreover, a portion of the front groove from the point S1 to the point A further inclines with respect to the axis of the plunger 1 compared to a portion from the point A to the point B, which effectively prevents the projection 60 from being misguided to the rear groove 52b when the plunger 1 comes in contact with the pad and is pushed out to press the pad. The embodiment shown FIGS. 3A and 3B provides an advantage that, because the plunger 1 rotates from the touch to the pad, the rotational motion of the plunger 1 may strip native oxide film inherently formed on the surface of the pad, which resolves the poor contact of the plunger 1 with the pad.

In aforementioned embodiments, the inclined portion from the point A to the point B and that in the front groove, 51a or 51b, and that from the point C to the point S2 in the rear groove, 52a or 52b, have constant width. That is, the upper wall 501 and the lower wall 502 of those grooves are substantially in parallel to the other. The upper wall 501 is formed in the rear, while, the lower wall 502 is in the front. When the plunger 1 is pushed into the barrel 2, the projection 60 slides within the front groove, 51a or 51b, as coming in contact primarily with the lower wall 502; accordingly, the projection 60 may be securely guided in the front groove, 51a or 51b, in a condition where only the lower wall 502 makes a substantial angle with the axis of the plunger 1 without being in parallel with the upper wall 501. On the other hand, when the plunger 1 is stuck out, the projection 60 slides from the point C to the point S2 in the rear groove, 51*b* or 52*b*, as coming in contact primarily with the upper wall 501; accordingly, the upper wall 501 inclined with the axis, without being in parallel with the lower wall 502, may contribute the secure guidance of the projection 60 from the rear groove, 52*a* or 52*b*, to the front groove, 51*a* or 51*b*.

Third Embodiment

Figure 4A:
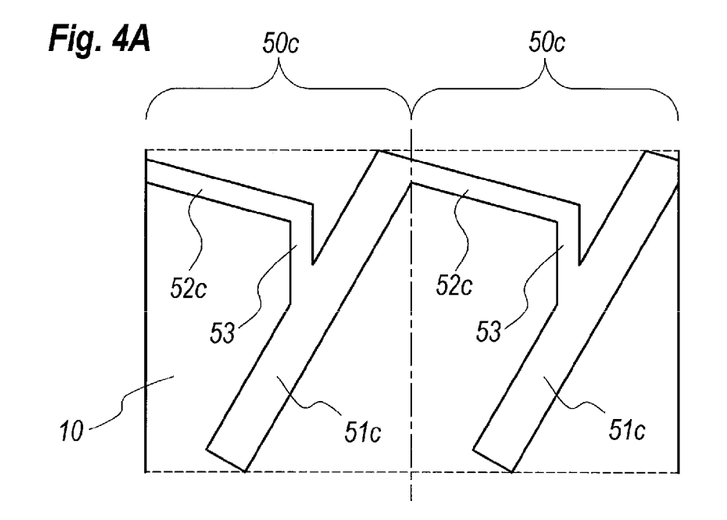
FIG. 4A is a developed view of the groove area according to the third embodiment.

FIG. 4A is a developed view of the area 10 according to the third embodiment of the invention. The third embodiment of the groove shown in FIG. 3 has a feature distinguishable from aforementioned embodiments that the groove includes the third put between the front groove 51*c* and the rear groove 52*c*.

The third embodiment also provides two unit patterns 50*c* each including the front groove 51*c*, the rear groove 52*c* and the intermediate groove 53 that connects the midpoint of front groove 51*c* with the end of the rear groove 52*c*. The other end of the rear groove 52*c* is connected with one end of the front groove 51*c*. The front groove 51*c* and the rear groove 52*c* each has a straight shape and inclined with the axis of the plunger 1 but the rear groove 52*c* is more inclined. The intermediate groove 53 also has the straight shape but is substantially in parallel to the axis.

Figure 4B:
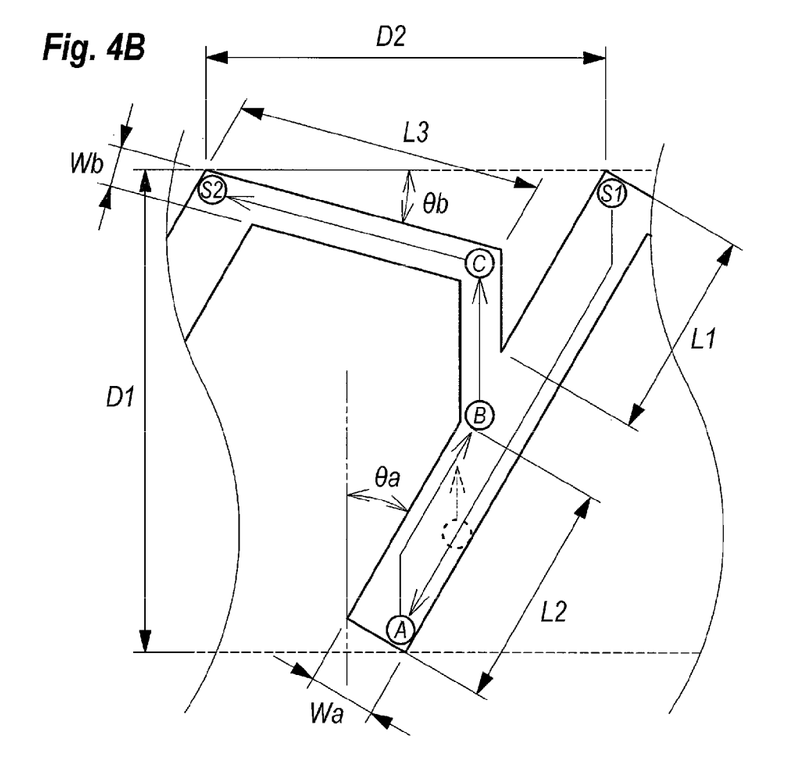
FIG. 4B shows the trace of the projection in the groove.

Next, the trace of the projection 60 will be described as referring to FIG. 4B. Before the touch of the tip of the plunger with the pad, similar to those in the aforementioned embodiments, the projection 1 is set in the point S1, the end of the front groove 51*c*. As pushing the plunger 1 outwardly, the projection 60 slides within the front groove to the other end, the point A, of the front groove 51*c*, and the plunger 1 may rotate working together the slide of the projection 60. Thus, the plunger 1 may continuously rotate from the touch in the tip thereof to the pad until the plunger 1 is fully pushed into the barrel 1.

On the other hand, when the plunger 1 is detached from the pad, the projection 60 first moves vertically from the point A until it touches the upper wall of the front groove, then slides on the upper wall to the point B, and finally enters the intermediate groove 53. Moving in the intermediate groove 53 from the point B to the point C, the projection 60 abuts against the upper wall of the rear groove 52*c* and slides in the rear groove 52*c* to the point S2. The plunger rotates reversely as the projection moves from the point A to point B, and rotates forwardly, the same direction when the projection 60 moves from the point S1 to the point A, as the projection 60 moves in the rear groove 52*c*.

The rotation of the plunger 1 in the present embodiment may show the same function and effect with those in the aforementioned embodiment. Moreover, the projection 60 may enter the rear groove 52*c* through the intermediate groove 53 even when the projection 60 is in the midway of the front groove 51*c*, that is, the projection is unnecessary to reach the end of the front groove 51*c* in order to return the rear groove 52*c*.

Typical dimensions of the front and rear grooves, 51*c* and 52*c*, and the intermediate groove 53 will be described by referring to FIG. 4B. Assuming that the plunger has a diameter of 2 mm and a longitudinal length D1 of the area 10 where the grooves are formed is about 5 mm, the pitch D2 of the unit pattern 50*c* is 3.1 mm. For the front groove 51*c*, the length L1 from the end S1 thereof to the edge of the intermediate groove 53 may be about 2 mm, while, another length L2 from the other end A to the other edge of the intermediate groove 53 may be about 3 mm, the width Wa thereof may be about 1 mm, and the inclined angle $\theta a$ to the axis of the plunger 1 may be about 40°. For the rear groove 52*c*, the length L3 and the width Wb thereof may be about 2.1 mm and about 0.5 mm, respectively; while, the inclined angle $\theta b$ to the axis may be about 30°. The depths of the grooves, The contact probe with the plunger 1 with dimension described above may be formed as follows: first forming grooves in the area 10 by a known fine processing technique such as electric discharge machining, on the other hand, the barrel 2 is formed a through hole in a area facing the area 10 of the plunger 1 when the barrel 2 receives the plunger 1. Setting the coil spring and the plunger 1 within the barrel 2, a pin is inserted into the through hole and mated with the groove in the outer surface of the plunger 1. The pin in the tip thereof shows a function of the projection 60. At least one of the groove and the pin may be coated with ceramics to reduce the abrasion by the slide of the projection 60 in the grooves.

Another method to form the contact probe according to embodiments of the present invention is carried out as follows. First, a barrel 2 is prepared, where the barrel 2 may be dividable into a plurality of pieces along the circumference and have grooves according to the embodiments aforementioned in an inner surface thereof corresponding to the area 10. The plunger 1 forms a projection in a position in the outer surface thereof corresponding to the groove of the barrel 2. Arranging respective pieces of the barrel around the coil and the plunger so as to set the coil and the plunger in respective position in the barrel 2, the barrel in respective pieces are assembled and integrated. The support member with a ring shape may fasten the pieces of the barrel 2, or the soldering and the welding may assemble the pieces.

First Modification

Figure 5A:
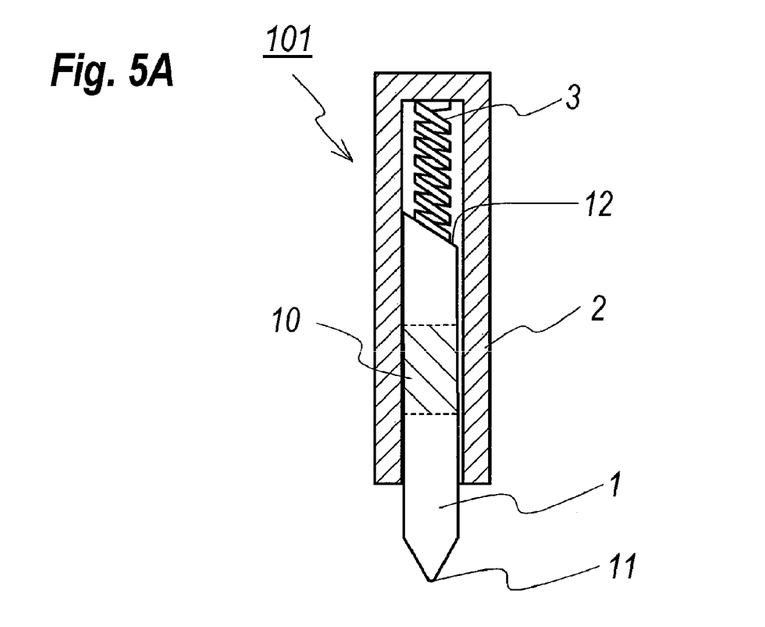
FIG. 5A shows a modified embodiment of the plunger where the rear end of the plunger is inclined with the axis thereof.

The contact probe 101 illustrated in FIG. 5A provides a plunger 1 whose rear end 12 is inclined with the axis thereof. The coil 3 pushes the rear end 12 of the plunger 1 so as to be offset from the axis, accordingly, a side surface of the plunger 1 may be securely come in contact with the inner surface of the barrel 2, which stabilizes the contact resistance therebetween. Moreover, as the forward and the rearward motion of the plunger 1, the plunger may rotate around the axis thereof; a portion of the inner surface of the barrel 2 coming in contact with the side of the plunger may vary.

Second Modification

Figure 5B:
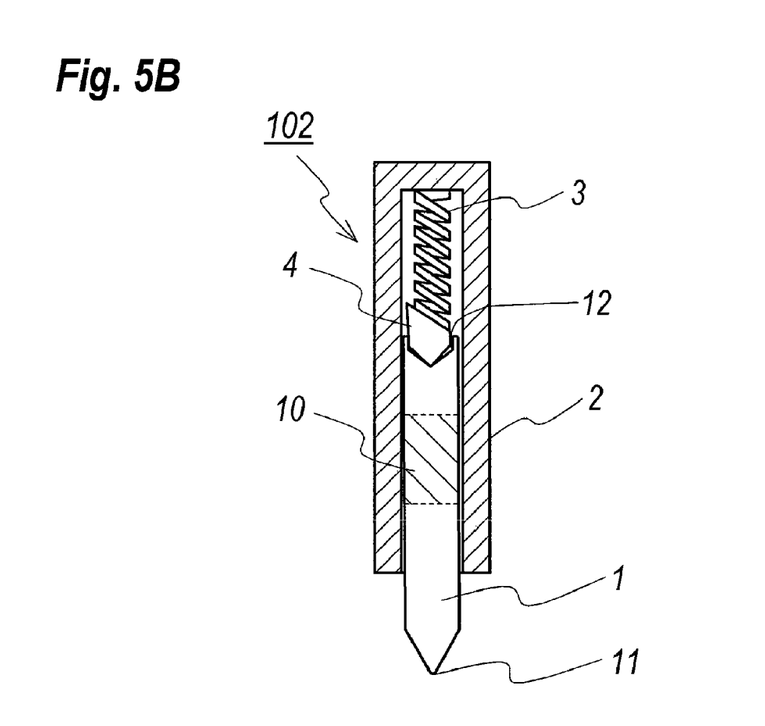
FIG. 5B shows another modification of the invention where an intermediate member is put between the coil and the end of the plunger.

The contact probe 102 shown in FIG. 5B has an intermediate member 4 between the end 12 of the plunger 1 and the coil 3, and the end 12 of the plunger 1 provides a hollow. The intermediate member 4 may be set within the hollow of the plunger 1 and may have a coned tip and an inclined end facing the coil 3. The coned tip of the intermediate member 4 abuts against the bottom of the hollow in the end of the plunger 1. In the arrangement shown in FIG. 5B, the coil makes the intermediate member 104 leaned with respect to the axis of the plunger 1, and the coned surface of the intermediate 4 pushes the end of the plunger 1 so as to be offset from the center thereof, which makes the side of the plunger 1 coming in contact to the inner surface of the barrel securely. Because the intermediate member 4 is kept idle when the plunger 1 rotates as it moves forward and rearward, the coil pushes the intermediate member 4 in the left side of the page, which may vary the surface of the side of the plunger 1 to come in contact with the barrel 2.

Third Modification

Figure 6:
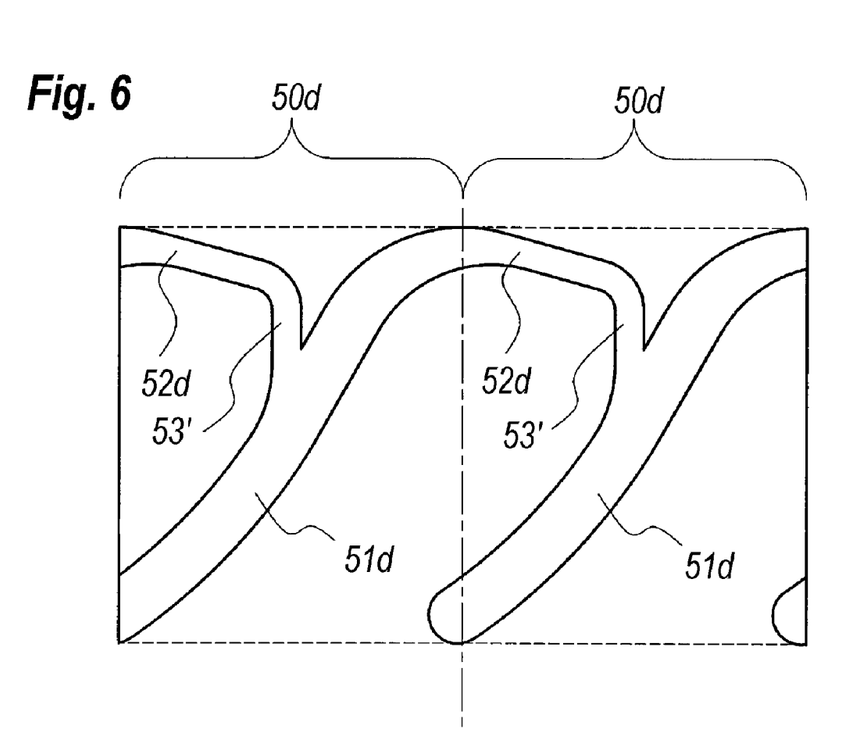
FIG. 6 shows still another modification of the arrangement of the groove.

FIG. 6 shows another shape of the grooves, 51d, 52d and 53'. In the third embodiment shown in FIGS. 4A and 4B, the grooves, 51c, 52c and 53, have sharpened corners. But the grooves, 51d, 52d, and 53', may have dulled corners as shown in FIG. 6. Moreover, the third embodiment has the rear groove 51 with a straight shape, but the rear groove 52d may have a curved shape with a gradually widening width. The curved rear groove 52d may slightly lengthen the front groove 51d, which may increase the rotation of the plunger 1 from the tough to the pad until it is fully pushed into the barrel 2. The arrangement shown in FIG. 6 may enhance the effect for the tip of the plunger 1 to strip the native oxide film on the pad.

Fourth Modification

A sharpened tip of the plunger 1 may easily strip the native oxide film on the pad, while, a dulled tip, for instance, a spherical shaped tip is hard to damage the pad. Both tip shapes of the plunger may narrower the area to come in contact; accordingly, the stress in the unit area may be enhanced and the frictional resistance may be reduced which facilitates the rotation of the plunger 1.

Fifth Modification

A diameter of the area 10 where the grooves are formed may be larger than a diameter in a side forward to the area 10. This arrangement may facilitate the process to from the groove and realize a secure contact to a minute pad and to pads with a fine pitch.

Although the present invention has been fully described in conjunction with the preferred embodiment thereof with reference to the accompanying drawings and some modifications thereof, it is to be understood that various changes and further modifications may be apparent to those skilled in the art. For example, more than two unit patterns may be formed in the surface of the plunger or in the inner surface of the barrel. In such an arrangement, the rotation of the plunger for one forward and rearward motion is reduced; accordingly, further durability may be estimated. Furthermore, each unit pattern may have a unique shape different to others and have an independent projection. Such changes and modifications are to be understood as included within the scope of the present invention as defined by the appended claims, unless they depart therefrom.

I claim:

1. A sensing probe for measuring an electrical performance of a semiconductor device, comprising:
   a barrel with a cylindrical shape, said barrel providing a projection in an inner surface thereof;
   an elastic member set within said barrel; and
   a plunger with a rod shape, said plunger being movable within said barrel along an axis of said barrel and having a groove in a groove area, said groove being continuous in a circumference of said plunger by iterating a unit pattern including a front groove and a rear groove,
   wherein said plunger rotates when said projection of said barrel slides within said front groove as said plunger is pushed into said barrel by said plunger in a tip thereof coming in contact with said semiconductor device, and said projection slides within said rear groove formed in next unit pattern as said plunger is pushed out from said barrel by a force of said elastic member.

2. The sensing probe of claim 1,
   wherein said front groove and said rear groove each has a straight groove extending substantially in parallel to said axis and an inclined groove inclined with said axis,
   wherein said plunger rotates when said projection slides in said inclined axis.

3. The sensing probe of claim 1,
   wherein said front groove and said rear groove each has a first portion and a second portion, said first portion of said front groove is further inclined to said axis compared to said first portion of said rear groove, and
   wherein said second portion of said front groove and said second portion of said rear groove are inclined to said axis substantially equal to each other.

4. The sensing probe of claim 1,
   wherein said unit pattern of said groove further includes an intermediate groove between said front groove and said rear groove, said intermediate groove being branched from a midway of said front groove.

5. The sensing probe of claim 4,
   wherein said front groove, said rear groove and said intermediate groove have substantially linear shape.

6. The sensing probe of claim 5,
   wherein said front groove has an width greater than a width of said intermediate groove and a width of said rear groove.

7. The sensing probe of claim 5,
   wherein said front groove and said rear groove have an arched shape with a dull corner.

8. The sensing probe of claim 1,
   wherein said groove area has a diameter larger than a diameter in a portion except for said groove area.

9. The sensing probe of claim 1,
   wherein at least said projection and said groove is coated in a surface coming in contact to each other with ceramics.

* * * * *